US006952349B2

(12) United States Patent
Gough et al.

(10) Patent No.: US 6,952,349 B2
(45) Date of Patent: Oct. 4, 2005

(54) MOTION CONTROL DEVICE (75) Inventors: Gerald Ronald Gough, Houghton Regis (GB); James Robert Kitchen, Nr. Tadley (GB); Jay K. Osborn, Crowthorne (GB); Stephen David Sparkes, Farnborough (GB); Sean Conor Wrycraft, Harrow (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/291,246

(22) Filed: Nov. 8, 2002

(65) Prior Publication Data
US 2003/0117779 A1 Jun. 26, 2003

(30) Foreign Application Priority Data

Nov. 8, 2001 (GB) .................................. 0126882
Nov. 30, 2001 (GB) .................................. 0128777

(51) Int. Cl.⁷ ............................................. H05K 1/14
(52) U.S. Cl. ...................... 361/741; 361/755; 361/759; 361/756
(58) Field of Search ................................ 361/741, 727, 361/755–756, 759, 752, 800, 797, 686, 802, 361/760; 439/377

(56) References Cited

U.S. PATENT DOCUMENTS

| 3,992,653 A | 11/1976 | Richardson et al. |
| 4,778,401 A | 10/1988 | Boudreau et al. |
| 4,872,853 A | 10/1989 | Webster |
| 4,914,552 A * | 4/1990 | Kecmer ...................... 361/801 |
| 6,021,049 A * | 2/2000 | Thompson et al. ......... 361/759 |
| 6,128,196 A | 10/2000 | Hoyle, Jr. et al. |
| 6,253,266 B1 | 6/2001 | Ohanian |
| 6,299,468 B1 | 10/2001 | Lin |
| 6,618,264 B2 | 9/2003 | Megason et al. |

FOREIGN PATENT DOCUMENTS

| EP | 0254056 | 6/1987 |
| GB | 2133223 | 7/1984 |

OTHER PUBLICATIONS

International search report application No. GB0128777.0 mailed Aug. 30, 2002.
International search report application No. GB0126882.0 mailed Jul. 10, 2002.

* cited by examiner

Primary Examiner—Randy Gibson
Assistant Examiner—Hung S. Bui
(74) Attorney, Agent, or Firm—Meyertons Hood Kivlin Kowert & Goetzel, P.C.; B. Noël Kivlin (57) ABSTRACT There is described a motion control device for preventing free-fall of electronics modules during vertical movement into or out of a supporting structure. The system comprises a rotatable element on the module or structure engageable with surface on the structure or module, respectively, for rolling movement therealong. The rotatable element is provided with a clutch or brake to provide resistance to rotation at least when the module is moving downward relative to the structure. The rotatable element may be a gear engageable with a toothed rack, or a friction roller engageable with a friction surface.

38 Claims, 8 Drawing Sheets

MOTION CONTROL DEVICE

FIELD OF INVENTION

The present invention relates to modular assemblies and is particularly concerned with electronic equipment comprising a supporting structure and a plurality of circuit sub-assemblies or modules mounted to the supporting structure wherein the modules require periodic removal from and replacement into the supporting structure.

BACKGROUND OF THE INVENTION

In conventional rack-mounted computer systems, a number of substantially planar electronics modules are arranged in horizontal or vertical planes extending from a front face of the rack to a rear face thereof. The modules are all connected to a vertical back plane by means of connectors arranged on a back edge of each module mating with co-operating connectors on the backplane. Installation and removal of individual modules from the system is effected by moving the modules in a horizontal direction towards or away from the backplane to connect or disconnect the connectors. The modules are received in horizontally-extending guides to ensure correct alignment and support for the modules.

The components of the electronics modules generate heat when they operate, and in order to remove this heat cooling air is caused to flow over the electronic components of the modules, with air being drawn in at one side of the module and expelled at the opposite side. The cooling air flows are preferably arranged to be in the same direction for all of the modules of the system, so that heated air expelled from one module is not drawn into a neighbouring module. Since a typical installation of a rack-mounted system will comprise a plurality of racks situated side-by-side, the direction of the cooling airflow is usually arranged to be from the "front" of the system to the "back". The vertical backplane, however, presents a barrier to such a cooling airflow and necessitates a change in airflow direction, which reduces cooling efficiency.

An improved front-to-back airflow is achieved by arranging the modules in vertical planes extending from front to back relative to the supporting structure in the rack-mounted system, with the interconnection of the modules being made by a horizontally arranged "baseplane" rather than a vertically arranged backplane. The front to back cooling airflow thus runs parallel to the plane of the baseplane, and heated air can be expelled from the back of each module without having to change direction to exit the system.

Mounting the baseplane in a horizontal orientation however requires the insertion and removal of modules from the system to be effected by moving the module vertically rather than horizontally to connect it to and disconnect it from the baseplane. For the modules to be insertable and removable with a single linear movement relative to the system supporting structure, the modules may be guided in vertical guides relative to the supporting structure, but to prevent the module from falling during insertion or removal an operative must support the weight of the module during insertion and removal procedures. The modules may weigh several kilograms, typically from 5 to 15 kg, and may have to be lifted or lowered at arm's length.

The modules and their exposed connectors are easily damaged if dropped, and the baseplane of the system may also be damaged if a module is dropped during insertion and falls on to the baseplane.

The present invention seeks to provide a motion control device and a modular assembly for housing a computer system which comprises the motion control device, and modules for an assembly, for controlling the movement of detachable modules relative to the supporting structure of the modular assembly.

SUMMARY OF THE INVENTION

According to a first aspect of the invention, there is provided an assembly for housing a modular electronic circuit, the assembly comprising a supporting structure having vertically extending guides, and at least one circuit module engageable with the guides for movement in a vertical direction between a mounted position and a dismounted position, the circuit assembly further comprising a motion control device having a first component provided on the module and a second component provided on the supporting structure, the first and second components of the motion control device being cooperable to resist downward movement of the module in the guides relative to the supporting structure.

According to a second aspect of the invention, there is provided a motion control device for providing a first degree of resistance to relative movement between first and second objects in a first movement direction, and a second, a smaller, degree of resistance to relative movement between the objects in a second movement direction opposite to the first.

A third aspect of the invention provides a motion control device for a modular assembly comprising a supporting structure and at least one module movable relative to the supporting structure in a movement direction into and out of a mounted position, the motion control device comprising an elongate engagement surface provided on either the supporting structure or module to extend in said movement direction, a rotatable element mountable to the other of the supporting structure and the electronic module to engage the engagement surface for rolling movement therealong, and a retarding device operable to resist rotation of the rotatable element in at least one rotation direction.

A fourth aspect of the invention provides a component for a motion control device, the component comprising a mounting plate, a swinging arm pivotally attached at one of its ends to the mounting plate for swinging movement towards and away from the mounting plate, a rotatable element mounted to a second end of the swinging arm, and a friction clutch or brake operable between the swinging arm and the rotatable element to resist rotation of the rotatable element in at least one rotation direction.

The invention provides, in further aspects, an electronic circuit module comprising a component of a motion control device, and a supporting structure for a modular circuit comprising a component of a motion control device.

BRIEF DESCRIPTION OF THE DRAWINGS

Embodiments of the invention will now be described in detail with reference to the accompanying drawings, in which like parts are given like reference numbers. In the drawings.

DETAILED DESCRIPTION

Figure 1:
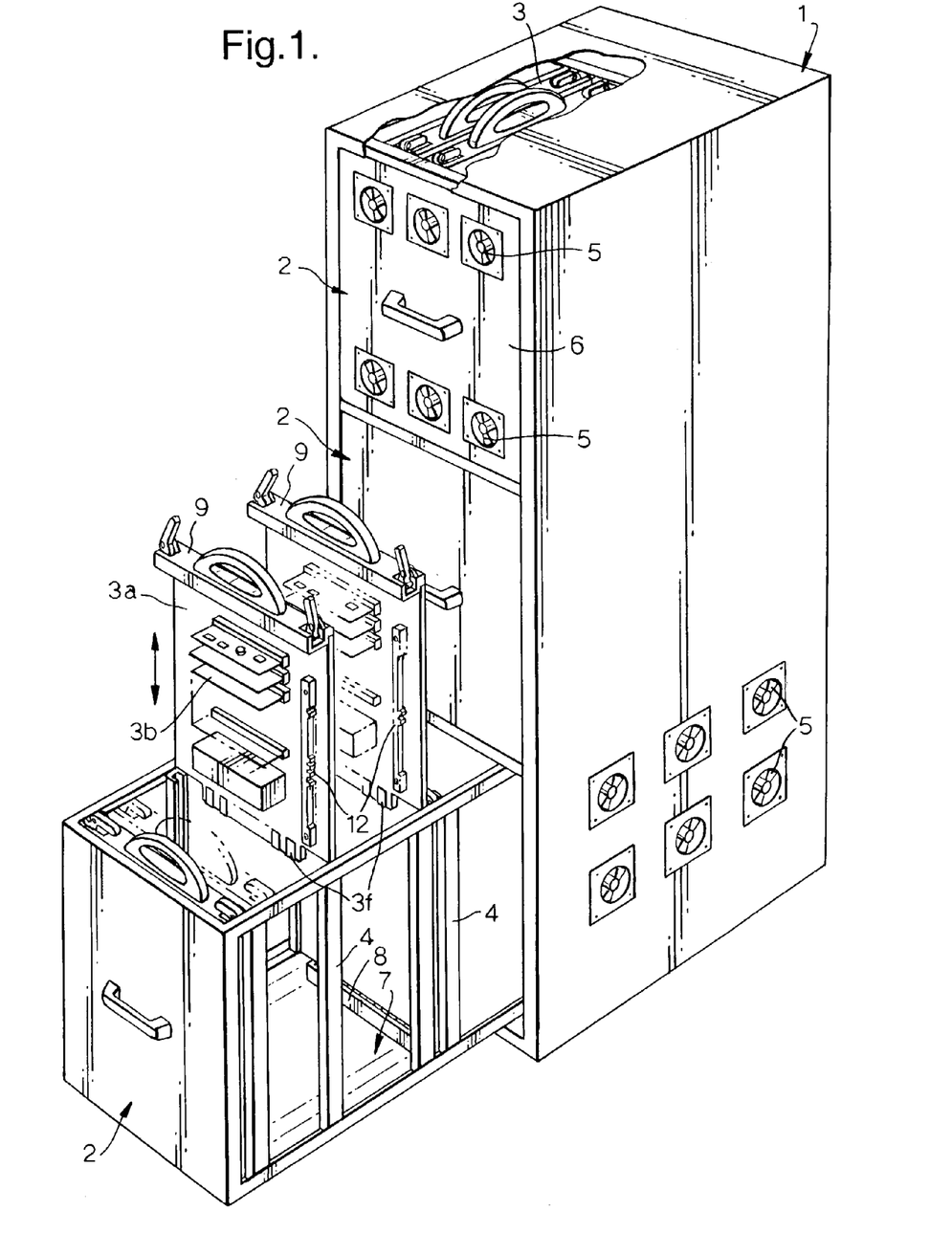
FIG. 1 is a perspective view of a modular computer system with vertically-arranged modules.

Referring now to the Figures, FIG. 1 shows a perspective view of modular assembly comprising a plurality of substantially planar electronic modules mounted in vertical orientations in slide-out drawers of a rack chassis to form a computing circuit.

In the embodiment shown, the chassis 1 comprises three drawers 2, each drawer housing a number of electronic modules 3.

The modules 3 are generally planar in configuration, and are arranged in vertical planes in the drawers 2.

The drawers 2 are slidingly mounted to the chassis 1 for movement in the direction of arrow A between a retracted, operating position and an extended, maintenance position. The lowermost drawer 2 is shown in the extended, maintenance position, while the upper two drawers are in the operating position.

In the embodiment illustrated, the modules 3 are mounted in vertical planes within the drawers, vertical guides 4 being provided to receive opposing edges of the modules 3 in sliding engagement. In the lowermost drawer 2 of the chassis 1 shown in FIG. 1, the modules 3 are arranged in planes extending across the drawer, i.e. perpendicularly to the movement direction (A) of the drawer. It is, however, also possible that the modules may be arranged in planes extending from the front to the back of the drawer, as illustrated in relation to the uppermost drawer in FIG. 1.

To provide cooling airflow over the components of the electronic modules, cooling fans 5 may be provided on the chassis 1 or on the drawer 2. When the modules are arranged to extend across the drawer, as in the lowermost drawer in FIG. 1, then cooling fans 5 may be mounted on the side of the chassis 1. An array of fans may be provided on each side of the chassis, one array drawing air from the outside and blowing it between the modules 3 within the drawer 2, and the other array of fans extracting air from within the drawer and exhausting it to the outside.

When the modules are mounted front-to-back in the drawer, as in the uppermost drawer in FIG. 1, the cooling fans 5 may be mounted to the drawer front 6, and/or either to a back wall of the drawer or to a back wall of the chassis 1 to provide a horizontal air flow between the modules 3 within the drawer 2. In this arrangement, the modules 3 are mounted in front-to-back orientation within the drawer, and cooling air is drawn in through the drawer front 6 and expelled through the rear of the chassis 1.

Electrical connections between the modules 3 are made through a horizontal base plane 7 situated in the bottom of each drawer 2, the base planes 7 of the drawers 2 being optionally connected to each other by cabling. The electronic modules 3 are electrically connected to the base planes by means of connectors situated on the lower edges of the modules 3 which cooperate with connecting sockets 8 on the base planes.

The electronic modules 3 are supported within the drawers 2 by means of vertically-extending guides 4 into which opposite edges of the electronic module 3 engage. In order to insert or remove a module 3, the module is moved vertically in the guides 4 towards or away from the base plane 7. In order to prevent the module 3 from freely falling in the guides 4 if the operative should release his grip on the module during insertion or removal, a motion control device is provided between the module 3 and the drawer 2. A first embodiment of the motion control device is shown schematically in FIGS. 2 and 3.

Figure 2:
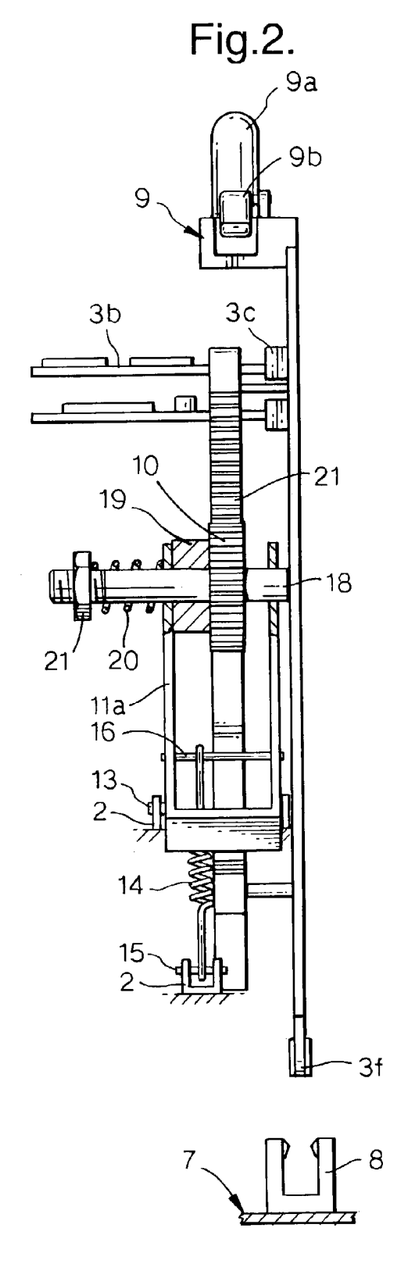
FIG. 2 is a schematic front view of a first motion control device according to the invention.
Figure 3:
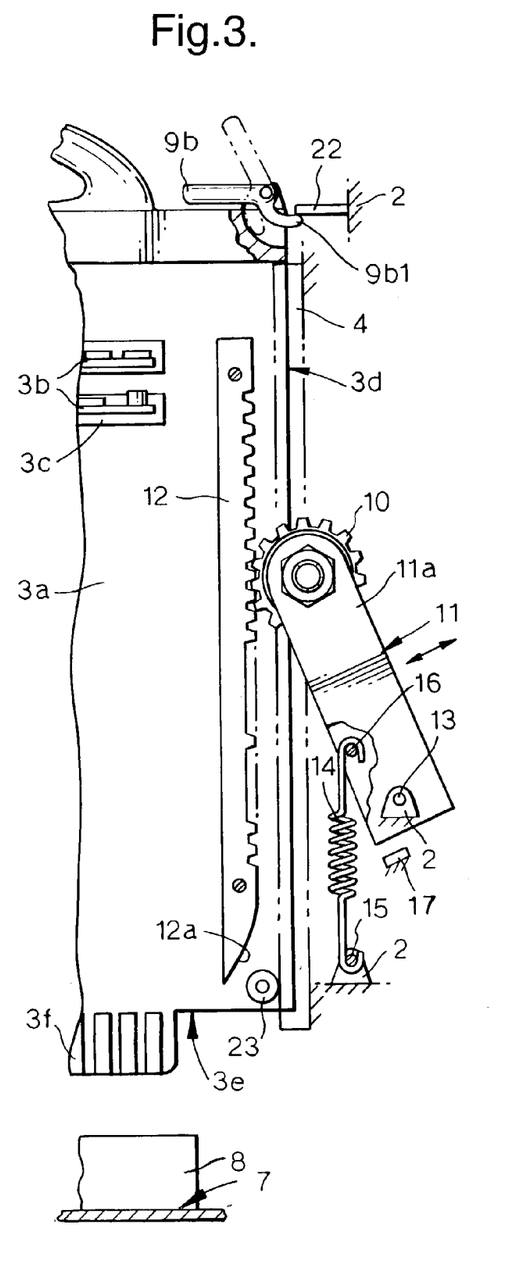
FIG. 3 is a side view of the motion control device of FIG. 2.

FIG. 2 is a front view and FIG. 3 is a side view of a motion control device and a module, showing only the operative parts of the assembly. The motion control device comprises a toothed wheel 10 mounted to a swinging arm 11 which is pivotally attached to a support 2a of the drawer 2, and a toothed rack 12 fixed to the module 3 and engageable with the toothed wheel 10 as the module moves along the guides 4.

The module 3 comprises a main circuit board 3a ("motherboard") to which subsidiary circuit boards 3b ("daughterboards") are attached by means of connectors 3c. The main circuit board 3a has a pair of opposing vertical side edges 3d which are engageable with the vertical guides 4 mounted to the drawer 2. The lower edge 3e of the main circuit board is provided with protruding connector portions 3f which are engageable with connection sockets 8 disposed on the base plane 7.

The upper edge of the main circuit board 3a is attached to a handle assembly 9 which provides a handling grip 9a and latching levers 9b, which will be described later.

The toothed rack 12 is attached to the main circuit board 3a to extend parallel to the side edge 3d. The rack 12 has its toothed face in a plane perpendicular to the plane of the main circuit board 3a, facing towards the side edge 3d.

The swinging arm 11 of the motion control device is pivotally mounted to a support 2a of the drawer 2 by means of a pivot pin 13. A biassing spring 14 extends between attachment points 15 and 16 on a support 2b of the drawer 2 and the swinging arm 11, respectively, to apply a tensile force causing the swinging arm 11 to rotate anti-clockwise as shown in FIG. 3. This biassing force urges the free end of the swinging arm 11 towards the toothed face of the rack 12. A limit stop 17 is provided on the drawer 2, to limit the clockwise rotation of the swinging arm 11.

At the free end of the swinging arm 11, the toothed wheel 10 is mounted for rotation about an axle 18. In the embodiment shown, the swinging arm 11 is in the form of a clevis, having a pair of slide plates 11a between which the toothed wheel 10 is mounted. The axle 18 extends through aligned bores in the side plates 11a.

To apply a frictional force resisting the rotation of the toothed wheel 10, a friction disk 19 is interposed between the toothed wheel 10 and one of the side plates 11a of the swinging arm 11. A compression spring 20 bears at one end on an adjusting nut 21 attached to the axle 18, and bears at its other end against the side plate 11a of the swinging arm 11. The compression spring 20 applies a tensile force to the axle 18, which draws the toothed wheel 10 and friction disk 19 into close contact with the inside face of the side plate 11a. The urging together of the side plate, friction disk and toothed wheel provides a friction force on the toothed wheel which resists relative rotation of the toothed wheel and the swinging arm. The magnitude of the frictional resistance can be adjusted by adjusting the compression in the compression spring 20, by moving the adjusting nut 21 along the axle 18.

With the module 3 removed from the drawer 2, the biassing spring 14 urges the swinging arm 11 to rotate until the swinging arm 11 contacts the limit stop 17. As a module is inserted into the drawer 2, by engaging the side edges 3d of the main circuit board of the module 3 with the vertical guide channels 4, the lower end of the toothed rack 12 will contact the toothed wheel 10. The lower end of the toothed rack 12 may have an oblique lead-in surface 22. As the toothed wheel 10 engages the lead-in surface 22, downward movement of the module 3 will cause the swinging arm 11 to rotate in a clockwise direction as seen in FIG. 3, tensioning the biassing spring 14. Further downward movement of the module 3 will cause the teeth of the toothed wheel 10 to engage with the teeth of the rack 12, so that the toothed wheel 10 will thereafter be rotated by continued downward movement of the module 3. This rotation of the toothed wheel 10 is resisted by the friction disk 19, and thus provides a retarding force against movement of the module 3.

Preferably, the amount of compression in the compression spring 20 is adjusted so that the frictional resistance to rotation of the toothed wheel 10 is not overcome unless the module 3 is subjected to a downward force applied by an operative. In other words, the frictional resistance of the toothed wheel 10 is capable of supporting the self-weight of the module 3 when the module is at rest, and is also capable of arresting downward movement of the module when an externally-applied downward force is removed.

In order that the toothed wheel 10 is retained in close engagement with the rack 12, the flank angles of the teeth of the toothed wheel 10 and the rack 12 are so arranged that the reaction force acting on the toothed wheel 10 during insertion of the module 3 results in a moment about the pivot pin 13 which urges the swinging arm 11 to rotate anti-clockwise, bringing the toothed wheel 10 into closer engagement with the rack 12.

As the operative applies a downward force to the module 3, frictional resistance of the toothed wheel 10 is overcome and the module moves down the guides 4. The length of the rack 12 is so arranged that resistance to downward movement is provided until the electrical contacts 3f at the lower edge of the main circuit board 3a are engaged with the connection socket 8 of the base plane 7.

The final movement of the module 3 to connect the module with the connection socket is preferably achieved by means of the latching levers 9b of the handle assembly 9 of the module 3. Latching levers 9b are moved to a raised position (shown in broken lines in FIG. 3) for removal and insertion of the module, and are rotated to a lowered position (shown in solid lines in FIG. 3) to lock the module into the drawer. With the latching lever in its raised position, the module 3 is moved into the guides 4 until the connecting portion 3f is adjacent the connection socket 8 of the base plane 7. The latching lever 9b is then rotated (anti-clockwise as seen in FIG. 3) so that a detent 9b1 of the lever 9b engages with an abutment surface 22 of the drawer 2. As the latching lever 9b is rotated to its closed position, a lever action urges the module 3 downwards so that the connection portion 3f enters the connecting socket 8 to complete the installation of the module.

In order to remove the module from the drawer, the latching levers 9b are raised to disengage the detent 9b1 from the abutment surface 22.

The detent 9b1 may engage an upward-facing abutment (not shown) so that raising the latching levers 9b also raises the module 3 to disengage the electrical connection portion 3f from the connecting socket 8. The handle 9a is then grasped and a vertical upward force applied to the module. As the module moves upwardly, the friction disk 19 provides a resistance to rotation of the toothed wheel 10. However, the reaction force between the rack 12 and the toothed wheel 10 is now acting to rotate the swinging arm 11 in the clockwise sense as seen in FIG. 3, tending to disengage the toothed wheel 10 from the rack 12. The toothed wheel 10 preferably does not rotate, but "jumps" over the teeth of the rack 12, providing a ratchet-type engagement. Should the operative cease to apply the vertically upward force withdrawing the module 3, the module is prevented from falling back in the guides by the engagement of the toothed wheel 10 and the rack 12. As the direction of the reaction force changes, the toothed wheel 10 is brought into close engagement with the rack 12 to prevent downward movement of the module.

Figure 4A:
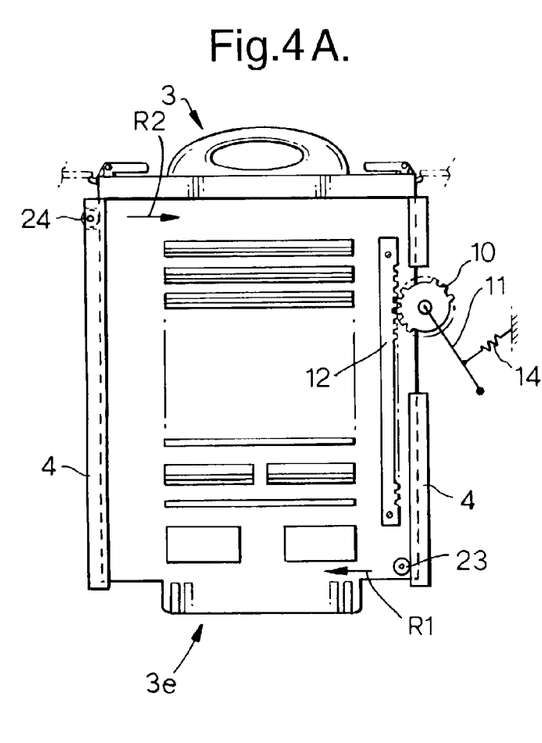
FIG. 4A is a side view showing a module, module guides, and the motion control device.
Figure 4B:
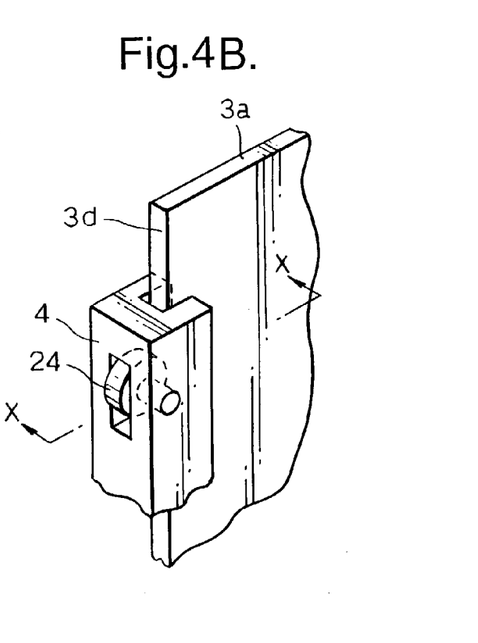
FIG. 4B is a detail perspective view of the upper end of the left-hand guide of FIG. 4A.
Figure 4C:
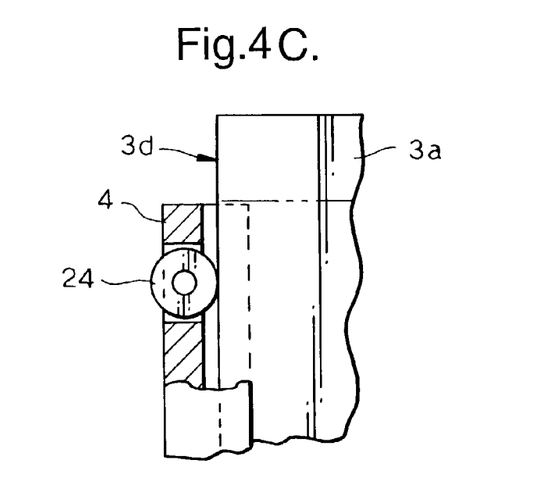
FIG. 4C a sectional view taken in the plane X—X of FIG. 4B.

In FIGS. 1 to 3, the module 3 is provided with a single rack 12 extending vertically adjacent one of its side edges 3d. Since the centre of gravity of the module 3 is spaced horizontally from the rack 12, the reaction between the toothed wheel 10 and the rack 12 causes a moment to be applied to the module, tending to rotate it about a horizontal axis perpendicular to the plane of the module. This rotation can cause the edges 3d of the module to become jammed in the guides 4. FIG. 4 shows an arrangement for overcoming this difficulty by providing a pair of reaction rollers to counteract the moment caused by the asymmetric vertical forces.

FIG. 4A illustrates schematically a module 3 having a rack 12, and a pair of vertical guides 4. The right-hand guide is separated into upper and lower portions, between which is mounted a swinging arm 11 and toothed wheel 10 biassed towards the rack 12 by a biassing spring 14. Adjacent the lower edge 3e of the module, at its side adjacent the rack 12, a first reaction roller 23 is mounted to the main circuit board 3a of the module 3. In the embodiment shown, the first reaction roller 23 engages an inwardly-facing surface of the guide 4, to produce a horizontal reaction on the module 3 indicated by the arrow R1 in FIG. 4A. At the upper end of the left-hand guide, a second reaction roller 24 is provided to engage the edge 3d of the main circuit board 3a. The reaction between the second reaction roller 24 and the module 3 produces a second horizontal reaction force on the module 3, indicated by the arrow R2.

As the module 3 is moved downwardly between the guides 4, the reaction forces R1 and R2 provide a moment to counteract the moment generated by the horizontal offset of the reaction force on the rack 12 and the downward force on the module 3. The module 3 is thus prevented from rotating and jamming in the guides 4.

As an alternative to the reaction rollers 23 and 24, the module may be provided with a symmetrical arrangement of two racks 12, to cooperate with respective toothed wheels 10 mounted on swinging arms 11 adjacent each of the guides 4. Such an arrangement will provide a symmetrical force distribution, and prevent jamming of the main circuit board 3a in the guide 4. It will be appreciated that if the centre of gravity of the module 3 is offset relative to the vertical centre line of the module, this will generate a moment tending to jam the module in the guides if the reaction forces exerted by both of the toothed wheels are equal. It is therefore foreseen that the reaction forces of the two toothed wheels may be different from each other, in order to compensate for horizontal offsetting of the centre of gravity of the module. To achieve this, the compression spring 20 of the motion control device nearest to the centre of gravity of the module is adjusted to increase the frictional resistance of its toothed wheel 10, so as to provide a larger reaction force at the side edge nearest the centre of gravity of the module.

Figure 5:
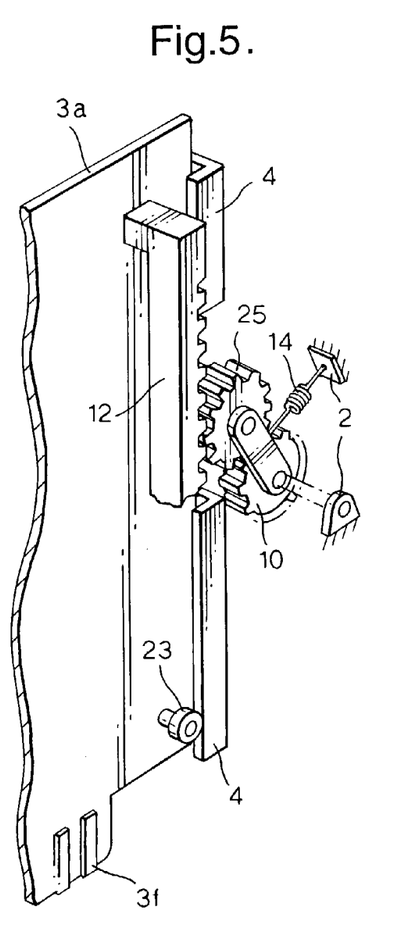
FIG. 5 is a schematic perspective view of a second motion control device of the present invention.

FIG. 5 shows an alternative arrangement for the motion control device. In the arrangement shown in FIG. 5, the rack 12 of the module 3 is engaged by an idler wheel 25, which meshes with a toothed wheel 10 mounted on a support 2c of the drawer 2 for rotation about an axis fixed in relation to the drawer 2. Link arms 26 connect the centres of the toothed wheel 10 and the idler wheel 25, and a biassing spring 14 coupled to a support 2d of the drawer 2 urges the link arms to rotate in order to bring the idler wheel 25 into close engagement with the rack 12. A friction resistance device operates on the toothed wheel 10 to resist rotation of the toothed wheel 10 in both directions, and this resistance is transmitted to the rack 12 during insertion of the module. As described previously, the flank angles of the teeth of the idler wheel 25 and the toothed rack 12 are so arranged that reaction forces on the idler wheel 25 urge the idler wheel 25 into closer engagement with the rack 12 during insertion of the module, and cause the idler wheel 25 to "jump" over the teeth in the rack 12 when the module is removed.

As before, the motion control device may be provided at one side only of the drawer, and the module may be provided with a first reaction roller 23 as before, with a second reaction roller 24 being provided in the guide opposite the motion control device. Alternatively, two motion control devices may be provided, as described above.

Figure 6:
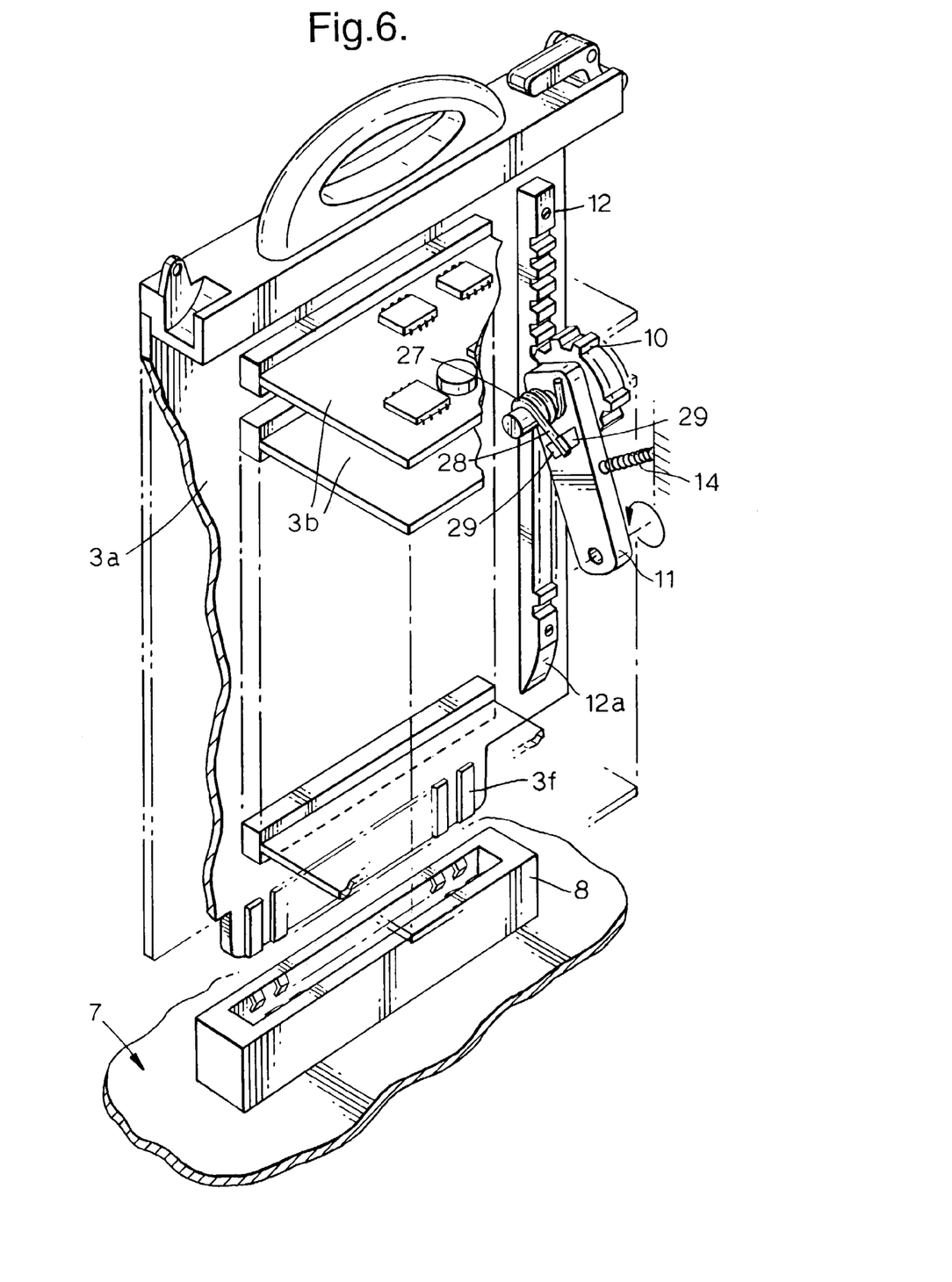
FIG. 6 is a schematic perspective view of a third motion control device of the present invention.

A further alternative embodiment of the motion control device is illustrate in FIG. 6. In this arrangement, the toothed rack 12 is positioned on the module 3 with the toothed face of the rack oriented to face away from the plane of the module 3.

The toothed wheel 10 is mounted to axle 18, and rotation of the axle 18 relative to the swinging arm 11 is resisted in one direction only by a unidirectional clutch. In the embodiment shown, a "Spragg" clutch is used, wherein a coil spring 27 is wrapped around the axle 18, and a tangentially-extending free end 28 of the coil spring 27 is captured between abutments 29 on the swinging arm 11. The direction of wrapping of the coil spring 27 round the axle 18 is such that rotation of the toothed wheel 10 caused by insertion of the module 3 is resisted, due to the frictional engagement between the spring 27 and the axle 18 tending to wrap the spring 27 more tightly about the axle 18. Conversely, as the module 3 is removed from the drawer 2, rotation of the toothed wheel 10 is in the sense which causes friction between the spring 27 and the axle 18 to loosen the coils of the spring 27, thus reducing resistance to rotation of the toothed wheel 10. The module is therefore removable from the drawer with substantially no resistance being applied by the engagement of the toothed wheel 10 and the rack 12. The coiled spring 27 shown in FIG. 6 may be replaced by any other suitable unidirectional friction element.

It will be appreciated that, with the toothed surface of the rack 12 facing away from the main circuit board 3a, the reaction between the toothed wheel 10 and the rack 12 will produce a reaction force on the module which is perpendicular to the plane of the module 3, increasing frictional resistance to movement between the edges of the main circuit board 3a and the guides 4. To counteract this, a second motion control device and a second rack 12 may be provided on the rear face of the module 3, aligned with the rack 12 on the front face so that the reaction forces produced by the respective motion control devices will cancel each other out. Alternatively, a supporting bearing may be provided on the near face of the module.

Figure 7:
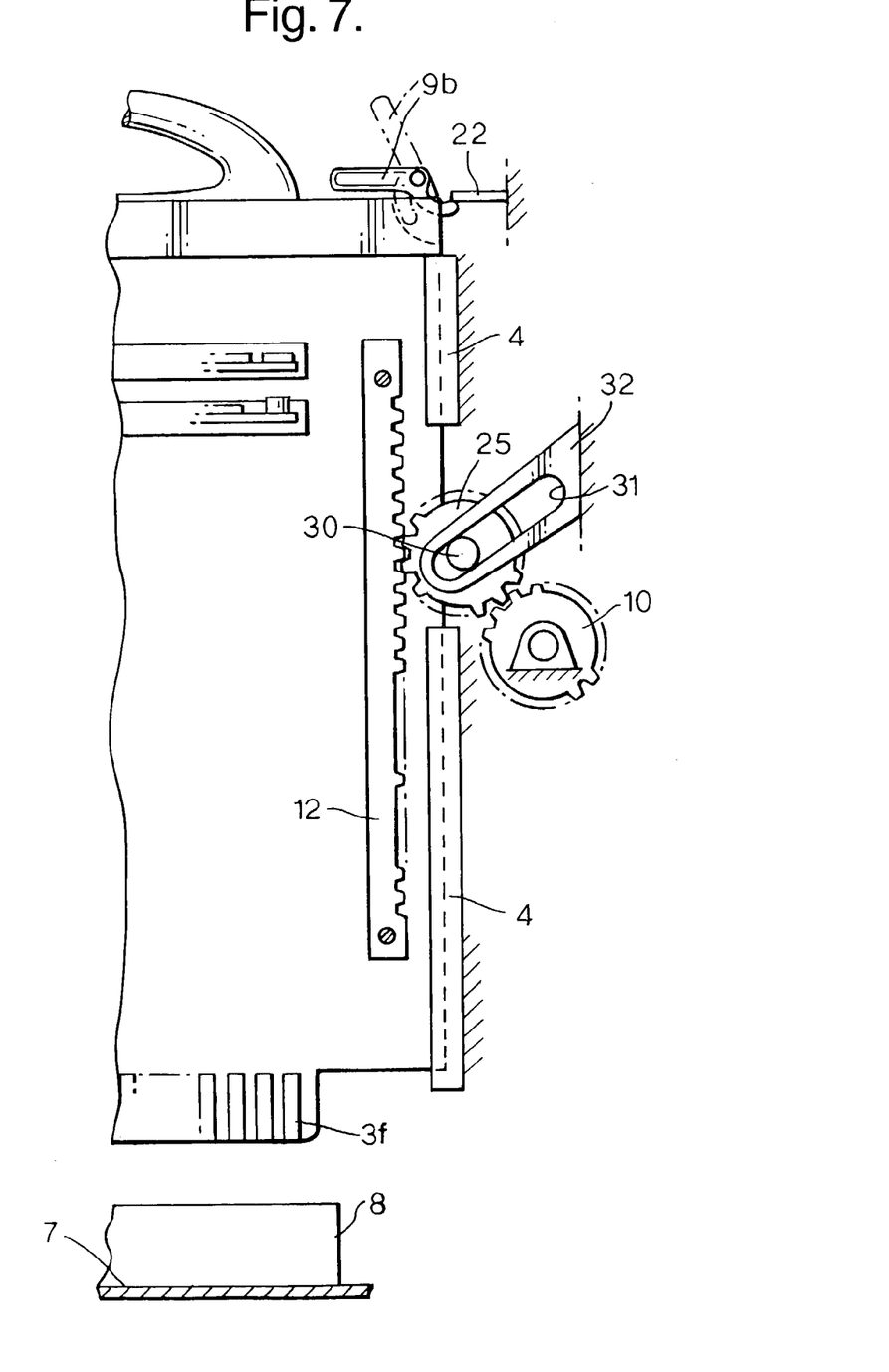
FIG. 7 is a schematic perspective view of a fourth motion control device of the present invention.

FIG. 7 shows a further alternative arrangement of the motion control device. The arrangement is similar to that shown in FIG. 5, with the toothed wheel 10 being mounted to the drawer 2 with friction means to resist rotation of the toothed wheel 10. An idler wheel 25 is provided, with the axle 30 of the idler wheel 25 received in a slot 31 in a guide 32 mounted to the drawer 2. The slot 31 may be straight, as shown in FIG. 7, or may be arcuate and concentric with the axis of the toothed wheel 10. The slot 31 is arranged so as to be downwardly convergent towards the rack 12, so that the reactions on the idler wheel 25 as the module 3 is inserted into the drawer cause the idler wheel 25 to be drawn into close engagement with the rack 12 and with the toothed wheel 10. When the module 3 is lifted out of the drawer 2, the idler wheel 25 is moved upward in the slot 31 and engagement between the idler wheel 25 and the rack 12 is released, allowing the module 3 to be removed substantially without resistance, as the idler wheel 25 "jumps" across the teeth of the rack 12. Should the module start to reenter the drawer, the idler wheel 25 is immediately engaged with the teeth of the rack 12 to prevent the module 3 from falling.

Figure 8:
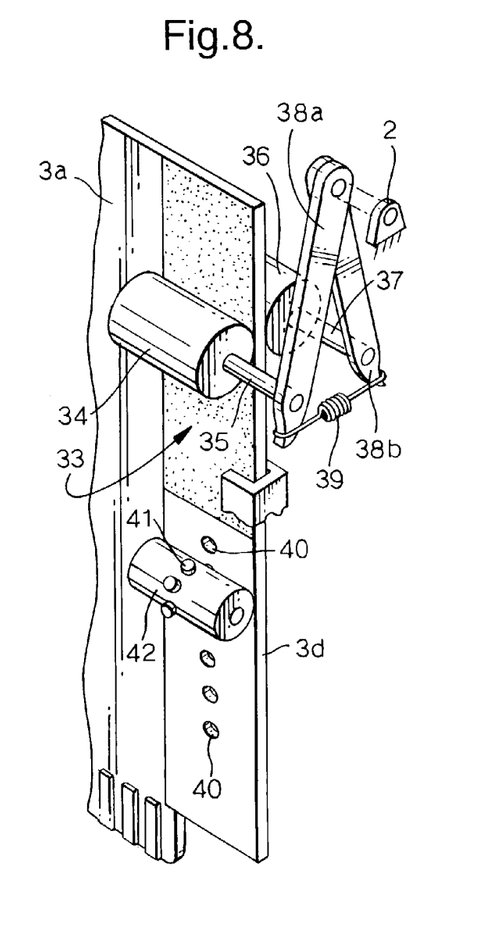
FIG. 8 is a schematic perspective view showing alternative engagements between the motion control device of the present invention and an electronics module.

FIG. 8 illustrates schematically alternative methods of engaging the motion control device and the module, otherwise by than the rack-and-pinion arrangements shown in FIGS. 1 to 7.

At the upper part of FIG. 8, there is shown a friction engagement wherein a friction surface 33 adjacent the edge 3d of the main circuit board 3a is engaged by a friction roller 34. The friction roller 34 may be supported on a shaft 35 so as to resist relative rotation of the roller 34 and shaft 35 in both directions by means of a friction clutch. Alternatively, the roller 34 may be mounted to the shaft 35 to resist relative rotation only in the insertion direction of the module 3. In order to provide sufficient pressure between the friction roller 34 and the friction surface 33, a back up roller 36 may be provided behind the module 3. In the arrangement shown, the back up roller 36 is mounted on a shaft 37, and the shafts 35 and 37 are mounted adjacent the free ends of a pair of swinging arms 38a and 38b pivotally mounted to a support 2e of the drawer 2. A tension spring 39 urges the ends of the arms 38 together, so that the friction roller 34 and the back up roller 36 form a nip through which the edge region of the main circuit board 3a passes during insertion and removal of the module.

The lower part of FIG. 8 shows a further alternative arrangement, wherein a series of recesses or openings 40 formed in an edge region of the main circuit board 3a are engaged by projections 41 on a sprocket roller 42. The sprocket roller 42 may be controlled by a unidirectional or bidirectional friction clutch, either directly or via a transmission, and may be urged into engagement with the main circuit board by being mounted on a swinging arm as illustrated in relation to the friction roller 34.

The recesses or openings 40 may be circular, as shown in FIG. 8, or may be square or rectangular. The recesses or openings may have edges shaped to cooperate with a gear wheel, or sprocket wheel.

Figure 9A:
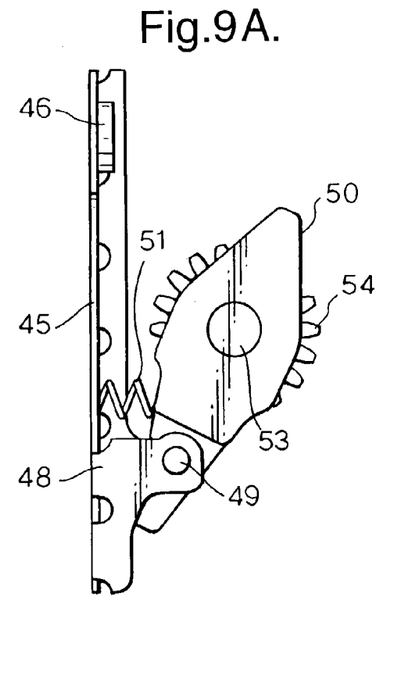
FIGS. 9A, 9B and 9C are side, front, and perspective views, respectively, of a fifth motion control device according to the invention.
Figure 9B:
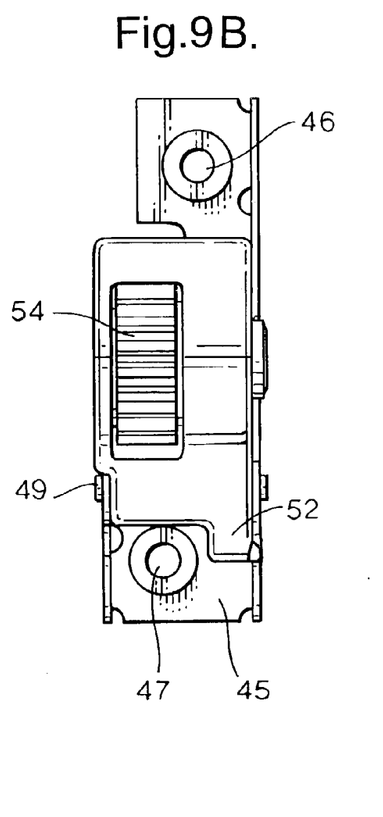
Figure 9C:
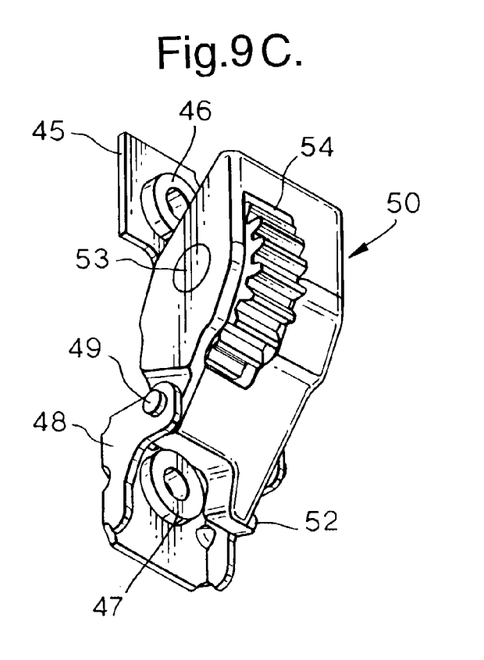

FIG. 9 illustrates a motion control device for attachment to a drawer of chassis to provide motion control for a vertically movable module 3. The motion control element comprises a fixing plate 45 providing with fixing locations 46 and 47 to accept fasteners such as screws, bolts of the like. Upstanding edges 48 of the fixing plate 45 support a pivot pin 49 on which is supported a gear housing 50. A biassing spring 51 is mounted between the fixing plate 45 and the gear housing 50, to urge the gear housing 50 away from the base plate 45. A heel part 52 of the gear housing 50 is contactable with the fixing plate 45 to limit the movement of the gear housing 50 away from the fixing plate.

The gear housing 50 supports a gear shaft 53 on which is mounted a gear wheel 54. Within the gear housing 50 is contained a friction clutch which provides frictional resistance to rotation of the gear wheel 54 in the clockwise sense as seen in FIG. 9A.

In use, the motion control device of FIG. 9 is attached to the drawer 2, so that the gear housing 50 is supported in such a position as to engage the rack 12 of a module 3 insertable in guides in the drawer. The motion control device may be provided only at one side of a module, adjacent one of the guides. Alternatively, two motion control devices may be provided for each module, one mounted adjacent each of the guides. The racks 12 and motion control devices may be arranged with the axis of the gear wheel 54 extending either parallel to or perpendicular to the plane of the main circuit board 3a of the module. The friction device within the gear housing 50 may provide frictional resistance to rotation of the gear wheel 54 in both rotation directions, or only in one.

A further embodiment of the invention is illustrated in FIG. 10, again with like parts being given like reference numerals.

Figure 10:
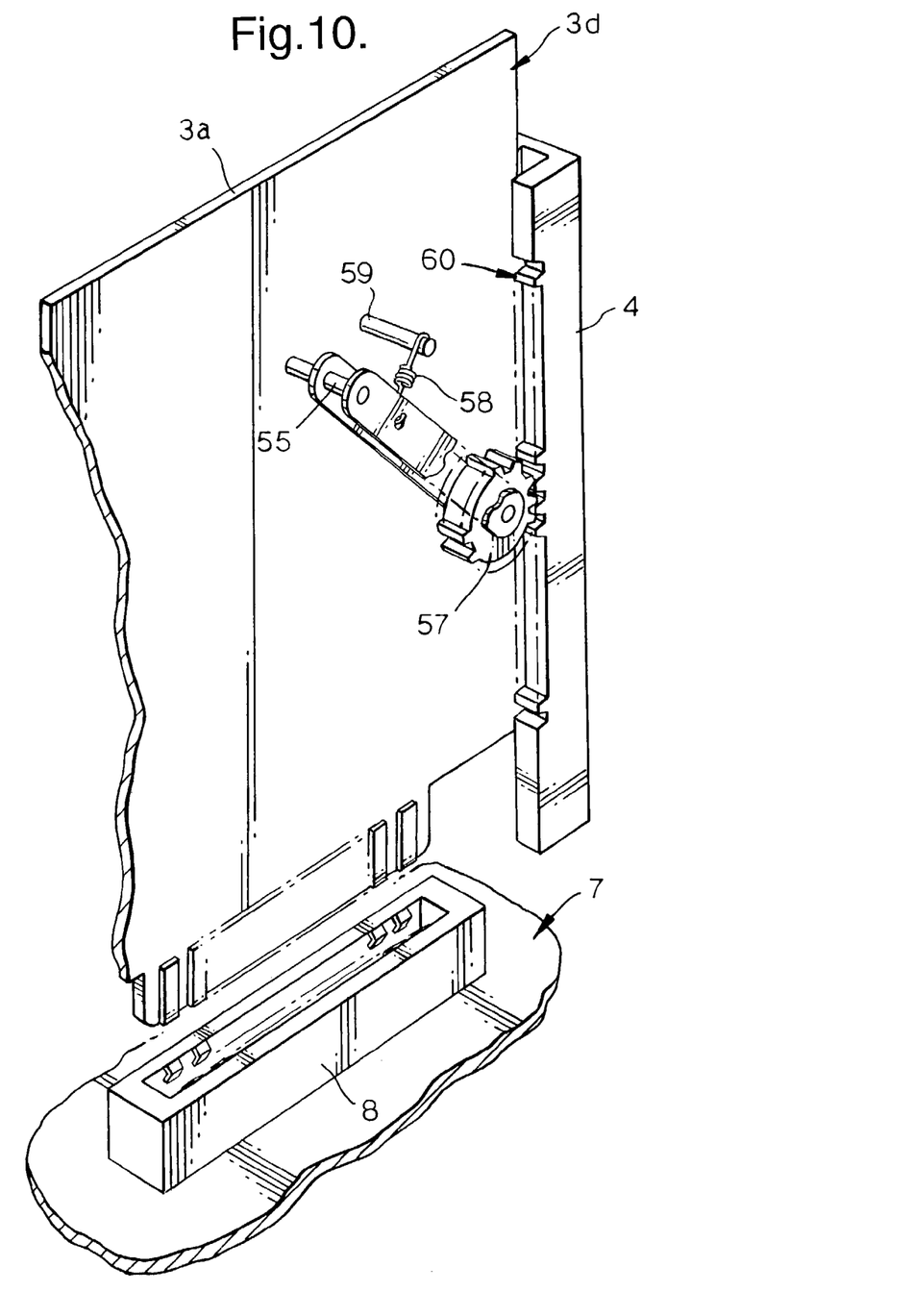
FIG. 10 is a schematic perspective view of a sixth motion control device according to the invention.

In this embodiment, the motion control device is mounted to the main circuit board 3a of the module, and engages a rack fixed to the supporting chassis or drawer. In this embodiment, the vertical guide which receives the edge of the main circuit board is formed with a toothed rack surface. In FIG. 10, the main circuit board 3a of the module 3 is provided with a mounting pin 55 on which is pivotally mounted a swinging arm arrangement 56 to support a toothed wheel 57. A tension spring 58 is fixed to the swinging arm 56 and to an anchor pin 59, to apply a moment to the swinging arm 56 to urge the toothed wheel 57 towards the edge 3d of the main circuit board 3a. The swinging arm 56 is arranged to extend downwardly and outwardly relative to the main circuit board 3a (when the main circuit board is in its insertion position). The guide 4 is provided with a rack surface 60 engageable by the toothed wheel 57. It will be understood that the rack surface 60 may be provided as a separate component to the guide 4.

During insertion of the module 3 into the drawer 2, the toothed wheel 57 engages the rack surface 60 and a friction device resisting rotation of the toothed wheel 57 provides an upward reaction force on the mounting pin 55 to support the weight of the module 3. When the operative exerts a downward pressure on the module 3, the toothed wheel 57 is rotated in engagement with the rack surface 60 and the module is moved into the drawer 2. When an operative applies an upward force to the module 3, the toothed wheel 57 may "jump" over the teeth of the rack surface 60, if, the rotation of the toothed wheel 57 is resisted in both directions. If a unidirectional clutch is provided, then the toothed wheel 57 may remain in engagement with the rack surface 60 but provide no resistance to removal of the module.

It will be understood that any of the motion control devices described above may be mounted to the module 3 rather than to the drawer 2, with the rack 12 mounted to the drawer 2 for engagement with the motion control device.

An advantage to mounting the motion control device on the module is that the frictional resistance provided by the motion control device may be tailored to suit the particular module to which it is mounted, with different degrees of frictional resistance being provided for modules of different mass. Each module may be provided with a single motion control device, or they may be mounted symmetrically in pairs. When a single motion control device is provided, the module and its guide may also be provided with reaction rollers. However, if the motion control device is mounted adjacent the lower edge of the main circuit board 3a, then the horizontal reaction produced by the motion control device may be sufficient to prevent jamming of the module in the guides.

While in the embodiments shown the electronic modules 3 are moved downwards to their installed positions, it is possible that the modules 3 may be mounted in "overhead" positions in which the modules are moved vertically upwardly during insertion to their mounted positions, and are removed by withdrawing them vertically downwards. Such a situation may arise in avionic applications where systems must be accommodated in limited space. It will be appreciated that the motion control devices are usable in such "overhead" mounting systems, but the direction of the resistance force applied to the module will be such as to prevent the module from falling out of its mount, rather than to prevent the module from falling into its mounted position.

It is also contemplated that the motion control devices may be provided to control insertion and/or removal of modules mounted for horizontal insertion and removal, to prevent an accidental application of excessive force resulting in the module being moved too quickly into or from its mounted position.

The movement speed of the module may be controlled in any of the above-described embodiments or situations by providing a resistance force which increases as the speed of the module relative to the supporting assembly increases, for example by using centrifugal clutch or a fluid damper device in addition to, or instead of, the friction clutch.

We claim:

1. A modular assembly for housing an electronic circuit, comprising a supporting structure having vertically extending guides, and at least one circuit module engageable with the guides for movement in a vertical direction between a mounted position and a dismounted position, the assembly further comprising a motion control device having a first component provided on the module and a second component provided on the supporting structure, and wherein the first and second components of the motion control device are cooperable when the module is between the mounted and dismounted positions to apply a force to the module at least equal to the weight of the module to resist downward movement of the module relative to the supporting structure in engagement with the guides under its own weight, and to permit downward movement of the module when a downward force additional to the weight of the module is applied thereto, wherein one of the first and second components is an elongated engagement surface, and the other of the second and first components comprises a rotatable element engageable with the engagement surface for rolling movement therealong, and includes a retarding device for generating resistance to rotary movement of the rotatable element in at least one rotation direction.

2. A modular assembly according to claim 1, wherein the module is moved from its dismounted position toward its mounted position by downward movement relative to the supporting structure.

3. A modular assembly according to claim 1, wherein the module is moved from its mounted position toward its dismounted position by downward movement relative to the supporting structure.

4. A modular assembly according to claim 1 wherein a plurality of motion control devices are provided for each module.

5. A modular assembly according to claim 1, wherein the retarding devices generates resistance to rotation of the rotatable element in both rotation directions.

6. A modular assembly according to claim 1, wherein the engagement surface is a toothed rack and the rotatable element is a gear wheel.

7. A modular assembly according to claim 1, wherein the engagement surface is formed on the module and the rotatable element is mounted to the supporting structure.

8. A modular assembly according to claim 1, wherein the engagement surface is provided on the supporting structure and the rotatable element is provided on the module.

9. A modular assembly according to claim 1, wherein the rotatable element of the motion control device associated with one module cooperate with their respective engagement surfaces to provide different amounts of resistance to downward movement of that module relative to the supporting structure.

10. A modular assembly according to claim 1, wherein one component of the motion control device is positioned adjacent a first side edge of the module, and the module further comprises a first reaction roller adjacent a lower end of said first edge.

11. A modular assembly according to claim 10, wherein the other component of the motion control device is positioned on the supporting structure adjacent a guide engageable with said first side edge of said module, and a second reaction roller is positioned at an upper end of a guide engageable with the other side edge of said module.

12. A modular assembly according to claim 1, wherein the retarding device comprises a friction element engaging the rotatable element to apply a force to resist rotation thereof.

13. A modular assembly according to claim 12, wherein the friction element applies a first force to resist rotation of the rotatable element in a first rotation direction, and applies a second, smaller, force to resist rotation of the rotatable element in a second rotation direction opposite to the first rotation direction.

14. A modular assembly according to claim 13, wherein vertically downward movement of the module relative to the supporting structure causes rotation of the rotatable element in said first rotation direction.

15. A modular assembly according to claim 1, wherein the first and second components of the motion control device are disengageable during vertically upward movement of the module relative to the supporting structure.

16. A modular assembly according to claim 15, wherein the motion control device comprises a rotatable element and an engagement surface, and the rotatable element is mounted for movement into and out of engagement with said engagement surface.

17. A modular circuit assembly according to claim 16, wherein the rotatable element is mounted to an end of a swinging arm.

18. A modular assembly according to claim 16, wherein the rotatable element is an idler wheel movable into and out of engagement with the engagement surface, and the idler wheel is engageable with a second wheel whose rotation is resisted in at least one rotation direction.

19. A circuit module for a modular assembly according to claim 1, wherein the module comprises side edges to cooperate with said guides, and an engagement surface extending parallel to said side edges.

20. A circuit module according to claim 19, wherein the engagement surface is a toothed rack.

21. A circuit module according to claim 19, wherein the engagement surface extends adjacent a first side edge of the module.

22. A circuit module according to claim 21, further comprising a reaction roller adjacent a lower end of said first side edge.

23. A circuit module for a modular assembly according to claim 1, wherein the module comprises side edges to cooperate with said guides, a rotatable element for engaging an engagement surface of said supporting structure, and a friction clutch or brake to resist rotation of said rotatable element.

24. A module according to claim 23, wherein the rotatable element is a gear wheel.

25. A module according to claim 23, wherein the friction clutch or brake applies retarding force to resist rotation of the rotatable element in both rotation directions thereof.

26. A module according to claim 25, wherein the friction clutch or brake applies a first retarding force to resist rotation in the first rotation direction, and a second retarding force different from the first to resist rotation in the second rotation direction.

27. A supporting structure to which a number of modules are mountable to form a modular assembly, comprising:
   guides for receiving respective modules for vertical movement relative to the supporting structure between respective mounted positions and dismounted positions;
   a motion control device component cooperable with a complementary motion control device component associated with one of the modules when the module is between the mounted and dismounted positions to apply a force to the module at least equal to the weight of the module to resist vertically downward movement of the module relative to the supporting structure under its own weight, and to permit downward movement of the module when a downward force additional to the weight of the module is applied thereto, wherein the motion control device component is a rotatable engagement with an engagement surface of the module.

28. A supporting structure according to claim 27, wherein the rotatable element is a gear wheel.

29. A supporting structure according to claim 27, wherein the motion control device component is an engagement surface extending parallel to said guides and engageable by a rotatable element associated with the module.

30. A supporting structure according to claim 29, wherein the engagement surface is a toothed rack.

31. A supporting structure according to claim 27, wherein two motion control device components are provided for each circuit module.

32. A supporting structure according to claim 31, wherein the two motion control device components are rotatable elements providing different amounts of resistance to relative movement of the module and the supporting structure.

33. A modular assembly for housing an electronic circuit, comprising a supporting structure having vertically extending guides, and at least one circuit module engageable with the guides for movement in a vertical direction between a mounted position and a dismounted position, the assembly further comprising a motion control device having a first component provided on the module and a second component provided on the supporting structure, and wherein the first and second components of the motion control device are cooperable when the module is between the mounted and dismounted positions to apply a force to the module at least equal to the weight of the module to resist downward movement of the module relative to the supporting structure in engagement with the guides, wherein one of the first and second components is an elongated engagement surface, and the other of the second and first components comprises a rotatable element engageable with the engagement surface for rolling movement therealong, and includes a retarding device for generating resistance to rotary movement of the rotatable element in at least one rotation direction.

34. A modular assembly for housing an electronic circuit, comprising a supporting structure having vertically extending guides, and at least one circuit module engageable with the guides for movement in a vertical direction between a mounted position and a dismounted position, the assembly further comprising a motion control device having a first component provided on the module and a second component provided on the supporting structure, and wherein the first and second components of the motion control device are cooperable when the module is between the mounted and dismounted positions to apply a force to the module at least equal to the weight of the module to resist downward movement of the module relative to the supporting structure in engagement with the guides, wherein the first and second components of the motion control device are disengageable during vertically upward movement of the module relative to the supporting structure, wherein the motion control device comprises a rotatable element and an engagement surface, wherein the rotatable element is mounted for movement into and out of engagement with said engagement surface, and wherein the rotatable element is mounted to an end of a swinging arm.

35. A modular assembly for housing an electronic circuit, comprising a supporting structure having vertically extending guides, and at least one circuit module engageable with the guides for movement in a vertical direction between a mounted position and a dismounted position, the assembly further comprising a motion control device having a first component provided on the module and a second component provided on the supporting structure, and wherein the first and second components of the motion control device are cooperable when the module is between the mounted and dismounted positions to apply a force to the module at least equal to the weight of the module to resist downward movement of the module relative to the supporting structure in engagement with the guides, wherein the first and second components of the motion control device are disengageable during vertically upward movement of the module relative to the supporting structure, wherein the motion control device comprises a rotatable element and an engagement surface, wherein the rotatable element is mounted for movement into and out of engagement with said engagement surface, and wherein the rotatable element is an idler wheel movable into and out of engagement with the engagement surface, and the idler wheel is engageable with a second wheel whose rotation is resisted in at least one rotation direction.

36. A supporting structure to which a number of modules are mountable to form a modular assembly, comprising:
  guides for receiving respective modules for vertical movement relative to the supporting structure between respective mounted positions and dismounted positions;
  a motion control device component cooperable with a complementary motion control device component associated with one of the modules when the module is between the mounted and dismounted positions to apply a force to the module at least equal to the weight of the module to resist vertically downward movement of the module relative to the supporting structure, wherein the motion control device component is a rotatable element engageable with an engagement surface of the module.

37. A supporting structure to which a number of modules are mountable to form a modular assembly, comprising:
  guides for receiving respective modules for vertical movement relative to the supporting structure between respective mounted positions and dismounted positions;
  a motion control device component cooperable with a complementary motion control device component associated with one of the modules when the module is between the mounted and dismounted positions to apply a force to the module at least equal to the weight of the module to resist vertically downward movement of the module relative to the supporting structure, wherein the motion control device component is an engagement surface extending parallel to said guides and engageable by a rotatable element associated with the module.

38. A supporting structure to which a number of modules are mountable to form a modular assembly, comprising:
  guides for receiving respective modules for vertical movement relative to the supporting structure between respective mounted positions and dismounted positions;
  a motion control device component cooperable with a complementary motion control device component associated with one of the modules when the module is between the mounted and dismounted positions to apply a force to the module at least equal to the weight of the module to resist vertically downward movement of the module relative to the supporting structure, wherein two motion control device components are provided for each circuit modules
  wherein one of the motion control device components is an elongated engagement surface, and another of the motion control device components comprises a rotatable element engageable with the engagement surface for rolling movement therealong, and includes a retarding device for generating resistance to rotary movement of the rotatable element in at least one rotation direction.

* * * * *

UNITED STATES PATENT AND TRADEMARK OFFICE
CERTIFICATE OF CORRECTION

PATENT NO. : 6,952,349 B2
DATED : October 4, 2005
INVENTOR(S) : Gough et al.

It is certified that error appears in the above-identified patent and that said Letters Patent is hereby corrected as shown below:

Column 12,
Lines 48-49, delete "rotatable engagement" and replace with -- rotatable element engageable --.

Column 14,
Line 51, delete "modules" and replace with -- module --.

Signed and Sealed this

Seventh Day of February, 2006

JON W. DUDAS
*Director of the United States Patent and Trademark Office*